United States Patent [19]

Ahonen

[11] Patent Number: 5,482,604
[45] Date of Patent: Jan. 9, 1996

[54] OFF-AXIS RADIO FREQUENCY DIODE APPARATUS FOR SPUTTER DEPOSITION OF RLG MIRRORS

[75] Inventor: Robert G. Ahonen, Cedar, Minn.

[73] Assignee: Honeywell Inc., Minneapolis, Minn.

[21] Appl. No.: 187,434

[22] Filed: Jan. 27, 1994

[51] Int. Cl.[6] ................................................ C23C 14/34
[52] U.S. Cl. ........................... 204/298.11; 204/298.26; 204/298.27; 204/298.28
[58] Field of Search .................... 204/298.11, 298.26, 204/298.27, 298.28

[56] References Cited

U.S. PATENT DOCUMENTS

| | | | |
|---|---|---|---|
| 4,767,516 | 8/1988 | Nakatsuka et al. | 204/192.14 |
| 5,328,582 | 7/1994 | Cole | 204/192.12 |
| 5,328,583 | 7/1994 | Kameyama et al. | 204/192.12 |

FOREIGN PATENT DOCUMENTS

| | | | |
|---|---|---|---|
| 63-137166 | 6/1988 | Japan | 204/298.28 |
| 3-6371 | 1/1991 | Japan | 204/298.11 |
| 3-204916 | 9/1991 | Japan | 204/298.11 |

*Primary Examiner*—Aaron Weisstuch
*Attorney, Agent, or Firm*—Craig J. Lervick

[57] ABSTRACT

A device for depositing a high quality thin film of material upon a surface is disclosed. The device is particularly adaptable to the construction of mirrors since it allows for coating of alternating layers of material. The quality of the film deposited is greatly improved by placing the substrates adjacent to the target surface and not directly in front of it. Furthermore, the substrates are rotated to improve uniformity of the coating.

14 Claims, 2 Drawing Sheets

5,482,604

OFF-AXIS RADIO FREQUENCY DIODE APPARATUS FOR SPUTTER DEPOSITION OF RLG MIRRORS

FIELD OF THE INVENTION

The following invention teaches a method and apparatus for coating substrates with thin films of material. More specifically, the invention discloses a method and apparatus for the fabrication of high quality mirrors by coating a substrate with a plurality of materials which will affect the reflective properties of the surface.

BACKGROUND OF THE INVENTION

Diode sputtering is a commonly used method of coating objects with a thin film of material. This method of material deposition has been used in the past for a number of applications including semiconductors, superconductors, and optical coating.

Generally diode sputtering first requires the creation of a gas discharge within a chamber. Operation of the gas discharge causes an exchange of electrons and ions between a cathode and an anode. Collision of ions with the cathode, or a target placed in front of the cathode causes material to be dislodged from the cathode and thus deposited on other objects within the chamber. Typically, the substrate or object to be coated is placed directly in front of the cathode. Because of its positioning in front of the cathode, material dislodged from the cathode is deposited on the substrate surface at a very high rate.

In a typical gas discharge a plasma exists between the cathode and the anode. The plasma is a collection of ions and electrons that have an overall neutral charge. During operation of the discharge ions are accelerated towards the cathode surface. Their collision with the cathode surface causes material to be released from the cathode surface, and, occasionally, a negatively charged ion is released. Due to the negative charge on the ion and the negative charge of the target, the negatively charged ion is accelerated away from the target at a very high rate. These highly accelerated ions pass through the plasma and collide with any objects that are directly in their path. Secondary electrons are also emitted from the surface being sputtered. These electrons are also accelerated across the dark space and can cause heating of objects in their path.

In the past the substrate has been placed directly in front of the cathode surface. Consequently, when negatively charged ions, as well as electrons, are released from the cathode surface and pass through the plasma they collide with the substrate surface. Due to the high energy these ions possess, their collision with the substrate surface is often very destructive, resulting in damage and imperfection of the thin film coating. The electrons can cause excessive heating of the substrate and undesirable film growth.

Diode sputtering is often used to fabricate high quality mirrors. These high quality mirrors then are used for such applications as lasers and ring laser gyroscopes. As is well known in the art, the mirrors are fabricated by depositing alternating layers of material upon a substrate. High quality mirrors are achieved by having each of these coatings be very uniform and of high quality.

Lastly, it is advantageous to produce a large quantity of mirrors at one time. This becomes very complicated since alternating layers of material are required for fabrication of a mirror. Gas purity and cathode material purity are a requirement for quality sputtering, consequently, it is necessary to provide a method to coat the substrate with alternating layers of material without opening and closing the chamber constantly.

SUMMARY OF THE INVENTION

It is an object of the present invention to provide a system which will produce high quality mirrors using diode sputtering. It is a further object of the present invention to provide a system that will produce high quality optical mirrors in mass quantities, and also is more adaptable to a production setting.

In the present invention, diode sputtering is used in the production of high quality mirrors. During deposition of the necessary thin films the substrates to be coated are placed adjacent to the cathode and not directly in front of the cathode. This positioning avoids direct collisions with the high energy ions that are occasionally released from the cathode. The coating process is, consequently, less destructive and achieves a uniform, higher quality coating.

As expected, the deposition rate is greatly reduced by placing the substrate in the off axis position. However, this problem is offset by a higher quality of thin film coating. Furthermore, the longer processing time is also offset by the ability to automate production. Lastly, by appropriately positioning the substrate fairly close to the cathode, a sufficient deposition rate is achieved.

To further enhance the quality and uniformity of the thin film coating the substrates are rotated or moved about within the coating chamber. In one embodiment of the present invention these substrates are rotated about an axis which is parallel to the cathode surface.

As is well known, the production of mirrors requires alternating layers of materials. A thin film coating of a first material must first be deposited on a substrate and then a thin film coating of a second material is deposited on top of the first material. This process is then repeated a number of times until the optical quality required is achieved. The present invention accommodates this need for deposition of different materials by providing two different cathodes within the sputtering chamber. Deposition of one material can be achieved through energizing the appropriate cathode and shielding the second cathode. Alternatively, deposition of the second material can be achieved by energizing the second cathode and shielding the first cathode. By having both cathodes within the chamber and allowing the capability of sputtering from either cathode at different times provides a system capable of manufacturing mirrors without operator intervention. Furthermore, this system can be automated to provide for mass production capabilities.

BRIEF DESCRIPTION OF THE DRAWINGS

Further objects and advantages of the present invention may be seen by reading the following detailed description of the invention in conjunction with the following drawings in which.

DESCRIPTION OF THE PREFERRED EMBODIMENT

Figure 1:
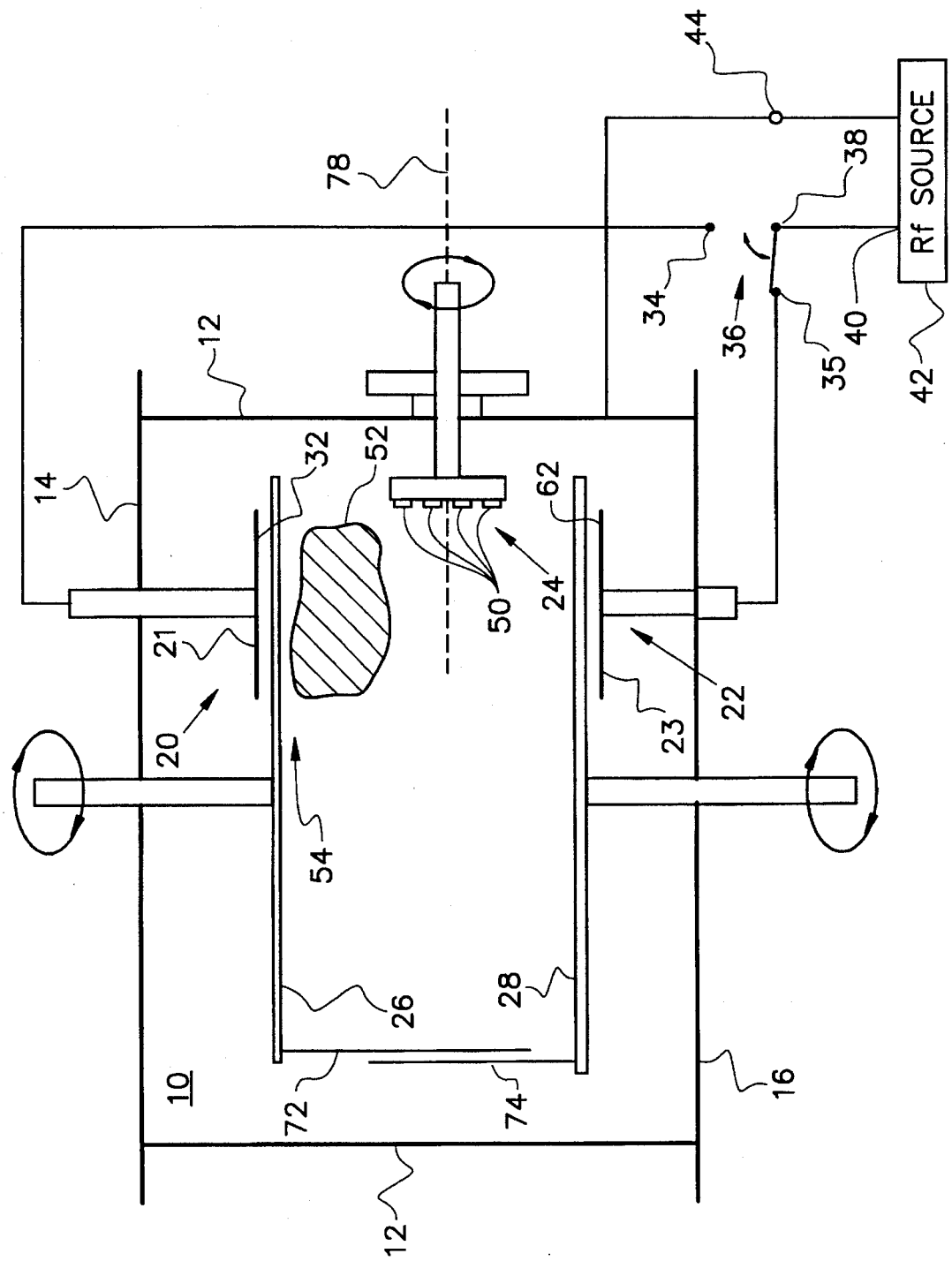
FIG. 1 is a cross-sectional diagram of the diode sputtering device.

Referring to FIG. 1, the diode sputter deposition process occurs within a sputtering chamber 10. Sputtering chamber 10 is an airtight chamber capable of maintaining gases at a specified pressure. The configuration of sputtering chamber 10 is somewhat irrelevant; however, it must be large enough to accommodate all of the necessary elements. These necessary elements are further outlined within this specification.

In the present embodiment sputtering chamber 10 takes on a cylindrical configuration. The chamber has a cylindrical outer wall 12 with an upper cover 14 and a lower cover 16. The means for evacuating the chamber is not shown, but is understood and well established in the art.

Within sputtering chamber 10, there are two different cathode assemblies, a first cathode assembly 20 and a second cathode assembly 22. Each of these cathodes operates similarly, therefore, operation will first refer to first cathode assembly 20 with the understanding that second cathode assembly 22 operates similarly.

In the present embodiment first cathode assembly 20 is located in an upper portion of sputtering chamber 10. First cathode assembly 20 has a cathode 21 constructed of an electrically conductive material having a first target surface 32 exposed towards the interior of sputtering chamber 10. First target surface 32 is coated with the material that is desired to be sputtered. In the present embodiment this material is silicon dioxide ($SiO_2$). It will be understood, by those skilled in the art, that a separate target (not shown) could be attached to first cathode 21, so as to allow sputtering therefrom.

First cathode 21 is electrically connected to a first terminal 34 of a switch 36. Switch 36 is a single pole, double throw switch having its pole 38 connected to a first terminal 40 of an RF source 42. RF source 42 has a second terminal 44 electrically connected to cylindrical outer wall 12 of sputtering chamber 10.

As previously mentioned, within sputtering chamber 10 is substrate handling means 24. Substrate handling means 24 is capable of carrying a number of substrates 50 and moving them to promote uniformity of coating. Substrate handling means 24 is positioned to hold substrates 50 adjacent to first target surface 32.

In order to deposit a thin film of material on the surface of substrates 50, a gas discharge is established within sputtering chamber 10. This discharge is established by energizing RF source 42 to apply an electrical potential between first cathode 21 and cylindrical outer wall 12. The establishment of this electrical potential causes electrons and ions to move about within sputtering chamber 10. Typically, a plasma 52 is created between the first cathode assembly 20 and the anode. Plasma 52 is a collection of ionic particles having an overall neutral charge. Between plasma 52 and first cathode 21 is a dark space 54. During operation of the discharge, ions are attracted towards target surface 32 of first cathode assembly 20. As these ions collide with first target surface 32, particles of first target surface 32 are released. These particles are then deposited on other objects within the vicinity of first target surface 32. One of the places these particles are deposited is on substrates 50.

Occasionally when particles are ejected from first target surface 32 these particles will have a negative charge. Due to the negative charge of these ionic particles and the overall negative charge of the target 21 these particles are accelerated across dark space 54 and into the plasma 52. These ionic particles then either collide with particles in plasma 52 or travel directly through plasma 52 and collide with any objects in their path. It is these particles that can cause destruction and irregularities in thin films. The primary direction that these high energy particles can be transmitted is directly away from first target surface 32. Secondary electrons are also emitted from the surface being sputtered. These electrons are also accelerated across the dark space and can cause heating of objects in their path.

Since substrates 50 are positioned adjacent to and not directly in front of first target surface 32, few of the high energy ions which are transmitted through the plasma 52 can collide with the surface of substrates 50. Therefore a coating of high quality material is deposited upon the surface of substrates 50.

Second cathode assembly 22, also positioned within sputtering chamber 10, is also capable of establishing a similar discharge which in turn allows for coating substrates 50 with a thin film of a second material. Second cathode assembly 22 also has a second cathode 23 with a second target surface 62 which is coated with a second material. Alternatively, it will be understood that a second target (not shown) could be positioned directly in front of second target surface 62. In the present embodiment the second material is titanium dioxide ($TiO_2$). Second cathode assembly 22 is positioned directly across from first cathode assembly 20. Therefore substrate handling means 24 is also adjacent second cathode assembly 22. Second cathode 23 is electrically connected to RF source 42 through switch 36. A second switch terminal 35 is electrically connected to second cathode 23.

When the RF source 42 is electrically connected to second cathode 23 a similar gas discharge is established within sputtering chamber 10. Now particles are ejected from second target surface 62 and deposited upon substrates 50. This deposition occurs in a manner identical to that previously described, thus achieving high quality, uniform thin films.

Figure 2:
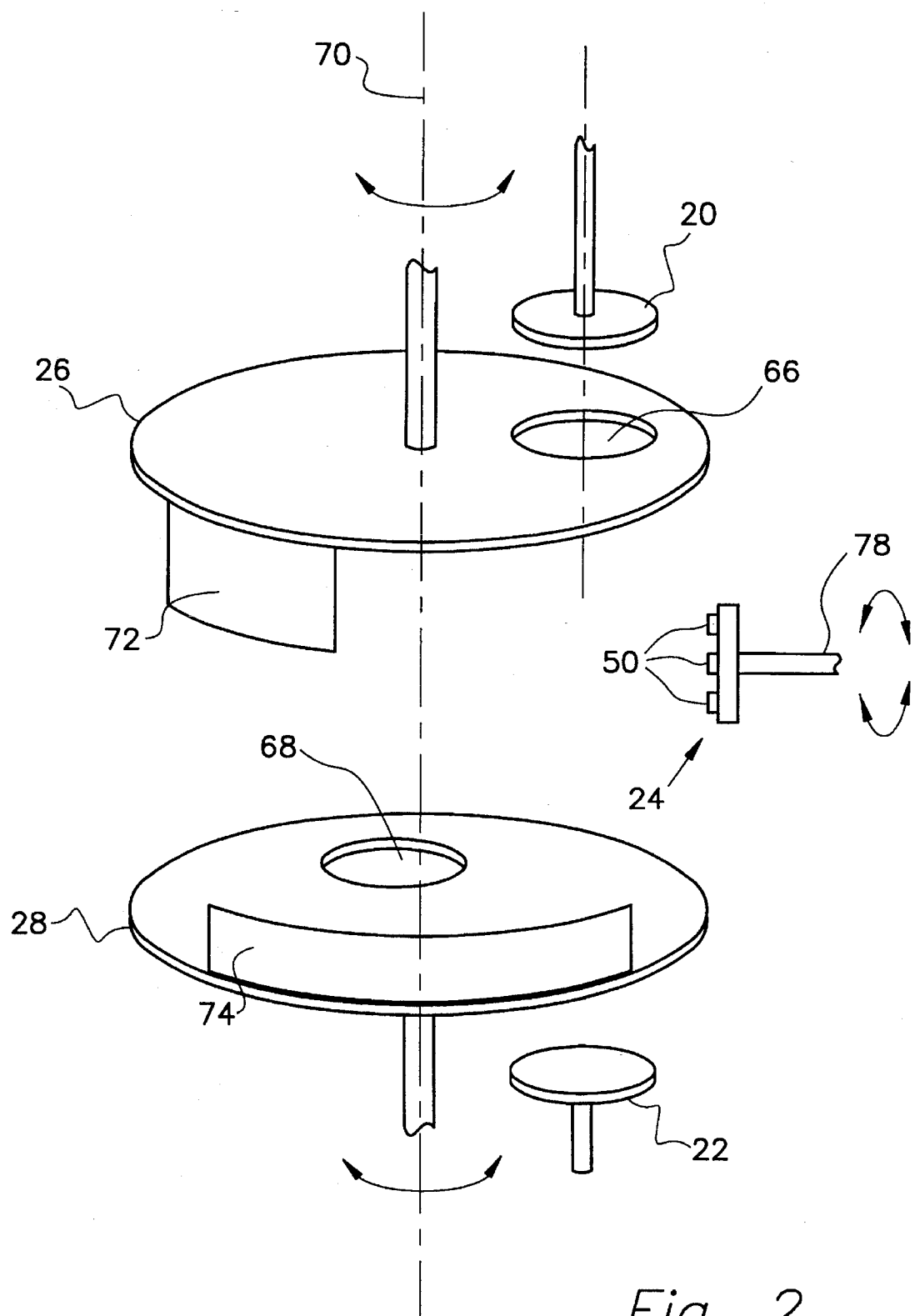
FIG. 2 is an exploded view of the diode sputtering device showing the cathodes, the substrate handling means, and the shielding apparatus.

Within sputtering chamber 10 there is also a first shutter plate 26 and a second shutter plate 28. Referring to FIG. 2, these shutters are each disc shaped with a hole 66, 68 therein. Furthermore, each shutter is capable of being rotated about a shutter rotation axis 70. First shutter plate 26 has a first shutter extension 72 extending therefrom. Similarly, second shutter 28 has a second shutter extension 74 extending therefrom.

First shutter plate 26 and second shutter plate 28 provide a number of important functions. When first shutter plate 26 is positioned such that hole 66 is positioned directly in front of first cathode assembly 20 this allows for sputtering from first cathode assembly 20. When material is being sputtered from first cathode assembly 20 second shutter plate 28 is positioned such that it is blocking second cathode assembly 22. This protects second cathode assembly 22 from having undesired material deposited upon it. Similarly second shutter plate 28 can be positioned that hole 68 is positioned directly in front of second cathode assembly 22. This allows for material to be sputtered from second cathode assembly 22. As would be expected, when material is sputtered from second cathode assembly 22, first shutter plate 26 is positioned to cover first cathode assembly 20.

Prior to coating substrates 50 it is often necessary to "clean" the target surface before deposition occurs. Therefore, when first shutter plate 26 is positioned to allow sputtering from first cathode assembly 20, second shutter plate 28 can be positioned so that second shutter extension 74 protects the substrates 50 from having material deposited thereon. First shutter extension 72 performs a similar function when material is being sputtered from second cathode assembly 22.

Substrates 50 are mounted upon substrate handling means 24. Substrate handling means 24 is capable of holding a large number of substrates and is also capable of rotating the substrates about a substrate handling axis 78. This rotation promotes uniformity and quality of the thin film coating. Also once a large number of substrates 50 are mounted upon substrate handling means 24 the substrates do not have to be repositioned or remounted. Furthermore, substrate handling means 24 could be configured so as to cause substrates 50 to be moved in a planetary fashion, further promoting uniformity of coating.

As has been demonstrated, the production of mirrors can be achieved by properly energizing the appropriate cathode and properly positioning the shutters so that alternating layers of material can be deposited upon substrates 50. This device is easily adaptable to a production setting and is capable of producing very high quality mirrors.

Having illustrated and described the principles of the invention in the preferred embodiment it should be apparent to those skilled in the art that the invention can be modified in arrangement and detail without departing from such principles. We claim all modifications coming within the spirit and scope of the following claims.

I claim:

1. An off-axis diode sputtering device for use in the construction of mirrors by sputtering alternating layers of material on a substrate, comprising:

a sputtering chamber capable of maintaining gas at a pressure required to establish a gas discharge, said chamber having a substantially cylindrical outer wall and a first cover and a second cover perpendicular to a central axis of said cylindrical outer wall, said cylindrical outer wall in conjunction with said first cover and said second cover forming said chamber;

a first cathode assembly disposed within said chamber in close proximity to said first cover, said first cathode assembly and adapted to have a first target material on a first target surface of said first cathode assembly opposite said first cover, said first target surface being perpendicular to said central axis;

a second cathode assembly disposed within said chamber in close proximity to said second cover of said chamber and adapted to have a second target material on a second target surface of said second cathode assembly, said second target surface being opposite said second cover and parallel to said first target surface;

shutter means comprising a first shutter plate and a second shutter plate both being substantially perpendicular to said central axis and situated between said first cathode assembly and said second cathode assembly and each having openings therein, said shutter means adapted for positioning said openings in front of said first target surface or said second target surface to allow sputtering from the exposed target, wherein said second shutter plate is positioned to block said second cathode assembly when said first cathode assembly is sputtering and said first shutter plate is positioned to block said first cathode assembly when said second cathode assembly is sputtering so as to avoid simultaneously sputtering from both first cathode assembly and second cathode assembly;

a switchable radio frequency source having one output terminal connected to said chamber and a second output terminal switchably connected to either said first cathode assembly or said second cathode assembly; and substrate handling means for holding a plurality of substrates in an orientation such that the substrate surface to be coated is parallel with said central axis and such that a radial vector normal to said substrate surface perpendicularly intersects said central axis, said substrate handling means for causing the substrates to be rotated about said radial vector.

2. The off-axis diode sputtering device of claim 1 wherein said shutter means and said switchable radio frequency source operate in conjunction with one another such that when said first cathode assembly is connected to said switchable source, said shutter means opening is positioned in front of said first cathode assembly, and when said second cathode assembly is connected to said switchable source, said shutter means opening is positioned in front of said second cathode assembly.

3. The off-axis diode sputtering device of claim 1 wherein said substrate handling means further comprises means for moving said substrates in a planetary fashion.

4. The off-axis diode sputtering device of claim 1 wherein said first shutter plate has a first shutter extension extending therefrom in a semi-cylindrical fashion, said second shutter plate has a second shutter extension extending therefrom in a semi-cylindrical fashion, whereby said first shutter plate and second shutter plate rotate independently about said central axis.

5. An off-axis diode sputtering device for use in the fabrication of mirrors by sputtering alternating layers of material onto the surface of a substrate, comprising:

a sputtering chamber capable of maintaining gas at a pressure required to establish a discharge;

a first diode sputtering device within said chamber having a first target with a planar sputtering surface facing the interior of said chamber;

a second diode sputtering device within said chamber having a second target with a planar sputtering surface facing the interior of said chamber, said planar sputtering surface of said second target parallel to and facing said planar sputtering surface of said first target;

substrate handling means for positioning a substrate such that a surface thereof is perpendicular to said planar surface of said first target, said substrate handling means adapted for rotating said substrate about a first axis normal to said substrate surface and parallel with said planar surface of said first target; and shutter means comprising a first shutter plate and a second shutter plate both situated between said first diode sputtering device and said second diode sputtering device and each having openings therein, said shutter means adapted for positioning said openings in front of said planar sputtering surface of said first target or said planar sputtering surface of said second target to allow sputtering from the exposed target, wherein said second shutter plate is positioned to block said second diode sputtering device when said first diode sputtering device is sputtering and said first shutter plate is positioned to block said first diode sputtering device when said second diode sputtering device is sputtering.

6. The off-axis diode sputtering device of claim 5 further comprising a switchable radio frequency source having one output terminal connected to said chamber and a second output terminal switchably connected to either said first diode sputtering device or said second diode sputtering device.

7. The off-axis diode sputtering device of claim 6 wherein said first diode sputtering device has a first cathode connected to said switchable radio frequency source, said first cathode positioned between said first target and a chamber wall.

8. The off-axis diode sputtering device of claim 6 wherein said second diode sputtering device has a cathode connected to said switchable radio frequency source, said cathode positioned between said second target and a chamber wall.

9. The off axis diode sputtering device of claim 5 wherein said first target sputtering surface is circular.

10. The off axis diode sputtering device of claim 5 wherein said second target sputtering surface is circular.

11. An off-axis diode sputtering device for use in the fabrication of mirrors by sputtering alternating layers of material onto the surface of a substrate, comprising:

a sputtering chamber capable of maintaining gas at a pressure required to establish a gas discharge;

a first diode sputtering means within said chamber having a first target with a planar surface facing the interior of said chamber, said first diode sputtering means for sputtering material from said planar surface of said first target onto a plurality of substrates;

a second diode sputtering means within said chamber having a second target with a planar surface facing the interior of said chamber, said planar surface of said second target parallel to and facing said planar surface of said first target, said second diode sputtering means for sputtering material from said planar surface of said second target onto said plurality of substrates;

sputtering shield means disposed between said first diode sputtering means and said second diode sputtering means, said sputtering shield means having a first planar member parallel to and facing said first diode sputtering means, said first planar member having a hole therein extending through said planar member, said first planar member capable of being positioned so that said hole is in front of said first target, said sputtering shield means having a second planar member parallel to and facing said second diode sputtering means, said second planar member having a hole therein, said second planar member capable of being positioned such that said hole is in front of said second target, wherein said second planar member is positioned to block said second diode sputtering means when said first diode sputtering means is sputtering and said first planar member is positioned to block said first diode sputtering means when said second diode sputtering means is sputtering; and substrate handling means for positioning a substrate such that a surface of said substrate is perpendicular to said planar surface of said first target and facing toward said first target, and for rotating said substrate about an axis perpendicular to said substrate surface.

12. The off-axis diode sputtering device of claim 11 wherein said first diode sputtering means comprises:

a source of radio frequency potential having a first and a second output terminal, wherein said first output terminal is electrically connected to said chamber;

a cathode positioned behind said first target, said cathode electrically connected to said second output terminal of said source.

13. The off-axis diode sputtering device of claim 11 wherein said second diode sputtering means comprises:

a source of radio frequency potential having a first and a second output terminal, wherein said first output terminal is electrically connected to said chamber;

a cathode positioned behind said second target, said cathode electrically connected to said second output terminal of said source.

14. The off-axis sputtering device of claim 11 wherein the substrate handling means further comprises means to simultaneously rotate said substrates in a planetary manner about a pair of axes, said pair of rotation axes both being perpendicular to said substrate surface.

* * * * *